# (12) United States Patent
Chew et al.

(10) Patent No.: US 8,917,521 B2
(45) Date of Patent: Dec. 23, 2014

(54) ETCH-BACK TYPE SEMICONDUCTOR PACKAGE, SUBSTRATE AND MANUFACTURING METHOD THEREOF

(75) Inventors: Hwee-Seng Jimmy Chew, Singapore (SG); Shoa-Siong Lim, Singapore (SG); Kian-Hock Lim, Singapore (SG)

(73) Assignee: Advanpack Solutions Pte Ltd., Singapore (SG)

( * ) Notice: Subject to any disclaimer, the term of this patent is extended or adjusted under 35 U.S.C. 154(b) by 647 days.

(21) Appl. No.: 13/097,033

(22) Filed: Apr. 28, 2011

(65) Prior Publication Data

US 2011/0267789 A1 Nov. 3, 2011

Related U.S. Application Data

(60) Provisional application No. 61/328,687, filed on Apr. 28, 2010.

(51) Int. Cl.
 H05K 7/10 (2006.01)
 H05K 7/12 (2006.01)
 H01L 23/495 (2006.01)
 H01L 21/683 (2006.01)
 H01L 21/48 (2006.01)
 H01L 23/00 (2006.01)
 H01L 23/31 (2006.01)
 H01L 21/56 (2006.01)

(52) U.S. Cl.
 CPC .... *H01L 23/49582* (2013.01); *H01L 23/49548* (2013.01); *H01L 2224/92* (2013.01);
 (Continued)

(58) Field of Classification Search
 USPC .......................... 361/676–784; 257/676–690; 174/262–266
 See application file for complete search history.

(56) References Cited

U.S. PATENT DOCUMENTS 5,672,909 A * 9/1997 Glenn et al. .................. 257/668
6,585,905 B1 7/2003 Fan et al.
(Continued)

*Primary Examiner* — Tuan T Dinh
(74) *Attorney, Agent, or Firm* — Rabin & Berdo, P.C.

(57) ABSTRACT

A semiconductor package, a substrate and a manufacturing method thereof are provided. The substrate comprises a conductive carrier, a first metal layer and a second metal layer. The first metal layer is formed on the conductive carrier and comprises an lead pad having an upper surface. The second metal layer is formed on the first metal layer and comprises a bond pad. The bond pad overlaps and is in contact with the upper surface of the first metal layer. The upper surface of the lead pad is partially exposed. A part of the bond pad overhang outward from the edge of the lead pad.

23 Claims, 9 Drawing Sheets

(52) U.S. Cl.
CPC ............... H01L 2924/0665 (2013.01); H01L 2924/01075 (2013.01); H01L 2224/27013 (2013.01); H01L 24/85 (2013.01); H01L 23/3107 (2013.01); H01L 2224/85001 (2013.01); H01L 24/83 (2013.01); H01L 2924/0105 (2013.01); H01L 2924/01029 (2013.01); H01L 2224/85447 (2013.01); H01L 2224/48091 (2013.01); H01L 2924/01046 (2013.01); H01L 2224/2919 (2013.01); H01L 2224/85411 (2013.01); H01L 2224/85455 (2013.01); H01L 2924/01028 (2013.01); H01L 2924/01006 (2013.01); H01L 2924/01047 (2013.01); H01L 2924/01014 (2013.01); H01L 2224/92247 (2013.01); H01L 24/29 (2013.01); H01L 2224/83051 (2013.01); H01L 24/32 (2013.01); H01L 2224/45144 (2013.01); H01L 2224/48247 (2013.01); H01L 2924/01033 (2013.01); H01L 2224/85464 (2013.01); H01L 24/97 (2013.01); H01L 2224/73265 (2013.01); H01L 2924/01082 (2013.01); H01L 2924/014 (2013.01); H01L 2224/85439 (2013.01); H01L 24/48 (2013.01); H01L 2924/01079 (2013.01); H01L 2224/32245 (2013.01); H01L 2224/83855 (2013.01); H01L 2224/97 (2013.01); H01L 21/6835 (2013.01); H01L 2224/85444 (2013.01); H01L 21/561 (2013.01); H01L 2924/01078 (2013.01); H01L 21/4832 (2013.01); H01L 2924/15311 (2013.01); H01L 2224/83101 (2013.01); H01L 24/45 (2013.01); H01L 2924/10253 (2013.01); H01L 2924/0132 (2013.01)
USPC ........... 361/767; 361/764; 361/772; 361/776; 361/782; 361/784

(56) References Cited

U.S. PATENT DOCUMENTS

| | | | |
|---|---|---|---|
| 6,969,905 | B2 | 11/2005 | Paulus |
| 6,995,460 | B1 | 2/2006 | McLellan et al. |
| 7,187,072 | B2 | 3/2007 | Fukutomi et al. |
| 7,270,867 | B1 * | 9/2007 | Kwan et al. .............. 428/111 |
| 7,365,441 | B2 | 4/2008 | Ikenaga et al. |
| 2003/0194855 | A1 | 10/2003 | Park et al. |
| 2008/0142936 | A1 | 6/2008 | Yilmaz et al. |
| 2010/0044850 | A1 | 2/2010 | Lin et al. |

* cited by examiner

ETCH-BACK TYPE SEMICONDUCTOR PACKAGE, SUBSTRATE AND MANUFACTURING METHOD THEREOF

This application claims the benefit of U.S. provisional application Ser. No. 61/328,687, filed Apr. 28, 2010, the subject matter of which is incorporated herein by reference.

BACKGROUND

1. Technical Field

This invention relates in general to a package, substrate and manufacturing method thereof, and more particularly to a semiconductor package, substrate and manufacturing method 2. Description of the Related Art Along with the advance of electrical industry, the demand for semiconductor packaging technology is booming. Generally speaking, electronic package consists of a silicon chip attached to the leadframe, uses encapsulating adhesive to seal the leadframe and the substrate to avoid moisture or damage caused by collision. The silicon chip has electrical connection through the bond pad of the leadframe to allow electrical connection with printed circuit board.

However, the leadframe with heavy weight and high volume is against the trend to promote light, thin, short and small electronic products.

SUMMARY

This invention relates in general to a substrate, its manufacturing method thereof and a semiconductor package. The substrate and the semiconductor package have external electrical connection through electrical points, so that the substrate and the semiconductor package are thinner, which keeps in step with the trend to promote light, thin, short and small electrical products.

According to the first aspect of the present invention, a substrate is provided. The substrate comprises a conductive carrier, a first metal layer and the second metal layer. The first metal layer is formed on the conductive carrier, wherein the first metal layer comprises an lead pad, and the lead pad has a first upper surface. The second metal layer is formed on the first metal layer, wherein the second metal layer comprises a bond pad, the bond pad overlaps and in contact with the first upper surface of the first metal layer, and the first upper surface of the lead pad is partially exposed. Wherein, a part of the bond pad overhang outward from an edge of the lead pad.

According to the second aspect of the present invention, a semiconductor package is provided. The semiconductor package comprises of a first metal layer, a second metal layer, a semiconductor die and an encapsulation layer. The first metal layer is formed on the conductive carrier, wherein the first metal layer comprises an lead pad, and the lead pad has a first upper surface and a first lower surface opposite to the first upper surface. The second metal layer is formed on the first metal layer, wherein the second metal layer comprises a bond pad, the bond pad overlaps and in contact with the first upper surface of the first metal layer, the first upper surface of the lead pad is partially exposed, and a part of the bond pad overhang outward from an edge of the lead pad. The semiconductor die is electrically connected to the bond pad via a plurality of first connection elements. The encapsulation layer encapsulates the first metal layer, the second metal layer and the semiconductor die, wherein the first lower surface of the first metal layer is exposed.

According to the third aspect of the present invention, a manufacturing method of substrate is provided. The manufacturing method comprises the following steps. A conductive carrier is provided. A first photo-resist layer is formed on the conductive carrier. An lead pad opening is formed on the first photo-resist layer to expose the conductive carrier. A first metal layer is formed, wherein the first metal layer comprises an lead pad, the lead pad is formed in the lead pad opening of the first photo-resist layer and has a first upper surface. A second photo-resist layer is formed on the first photo-resist layer. A bond pad opening is formed on the second photo-resist layer to expose the first upper surface of the lead pad. A second metal layer is formed, wherein the second metal layer comprises a bond pad, the bond pad is formed in the bond pad opening of the second photo-resist layer and has a second upper surface, and the bond pad overlaps and in contact with the first upper surface of the lead pad. The first and second photo-resist layers are removed, wherein the first upper surface of the lead pad is partially exposed and a part of the bond pad overhang outward from an edge of the lead pad.

According to the fourth aspect of the present invention, a manufacturing method of semiconductor package is provided. The manufacturing method comprises the following steps. A conductive carrier is provided. A first photo-resist layer is formed on the conductive carrier. An lead pad opening is formed on the first photo-resist layer to expose the conductive carrier. A first metal layer is formed, wherein the first metal layer comprises an lead pad and a die-attach pad, the lead pad is formed in the lead pad opening of the first photo-resist layer and has a first upper surface and a second upper surface opposite the first upper surface, the die-attach pad is formed in the die-attach pad opening and has a first upper surface. A second photo-resist layer is formed on the first photo-resist layer. A bond pad opening is formed on the second photo-resist layer to expose the first upper surface of the lead pad and the first upper surface of the die-attach pad. A second metal layer is formed, wherein the second metal layer comprises a bond pad, the bond pad is formed in the bond pad opening of the second photo-resist layer and has a second upper surface, and the bond pad overlaps and in contact with the first upper surface of the lead pad. The first and second photo-resist layers are removed, wherein the first upper surface of the lead pad is partially exposed and a part of the bond pad overhang outward from an edge of the lead pad. A semiconductor die is disposed on the die-attach pad. The bond pad and the semiconductor die are electrically connected via a plurality of first connection elements. An encapsulation layer is formed to encapsulate the first metal layer, the second metal layer and the semiconductor die. The conductive carrier is removed, wherein the first lower surface of the lead pad is exposed.

The invention will become apparent from the following detailed description of the preferred but non-limiting embodiments. The following description is made with reference to the accompanying drawings.

DETAILED DESCRIPTION

Figure 1:
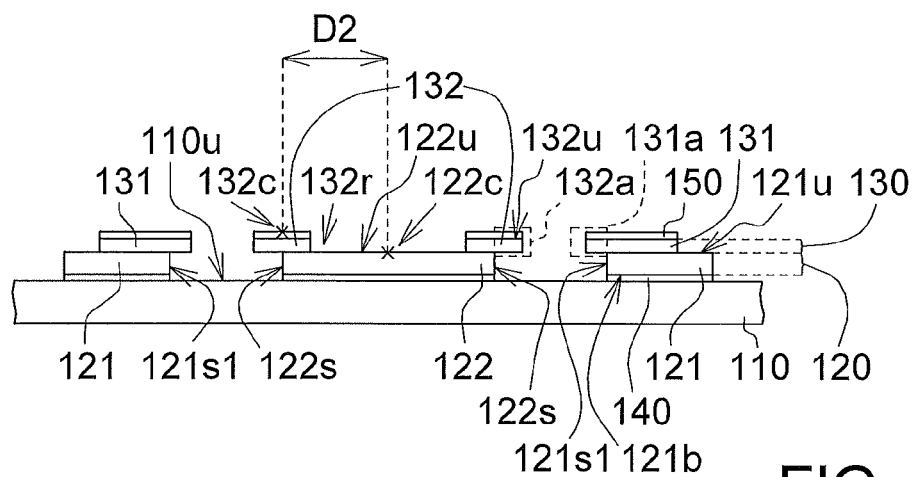
FIG. 1 shows a cross-sectional view of a semiconductor package according to an embodiment of the invention.

Referring to FIG. 1, a cross-sectional view of a substrate according to an embodiment of the invention is shown. The substrate 110 comprises a conductive carrier 110, a first metal layer 120, a second metal layer 130, a first surface finishing layer 140 and a second surface finishing layer 150.

The first metal layer 120 and the second metal layer 130 may be selected from the group comprising of Cu, Ni or combinations thereof. The first metal layer 120 is formed on the surface 110u of the conductive carrier 110, the first metal layer forms at least one lead pad 121 and at least one die-attach pad 122, and the lead pad 121 has the first upper surface 121u and the first lower surface 121b.

The second metal layer 130 is formed on the first metal layer 120. The second metal layer 130 forms at least one bond pad 131 and at least one die-attach barrier 132. The bond pad 131 overlaps and in connection with the first upper surface 121u of the lead pad, and part of the first upper surface 121u is exposed, that is, the exposed part is not cover by the second metal layer 130.

Referring to FIG. 1, the first metal layer 120 and the second metal layer 130 form a leadframe structure, and the conductive carrier 110 carries the leadframe structure. Wherein the lead pad 121 is an external lead and the bond pad 131 is an internal lead. Through the external and internal lead in the leadframe structure, the semiconductor device (such as the semiconductor die 160 according to FIG. 8) is electrically connected to the external electrical circuits. In addition, the leadframe structure may be a very thin electroplated structure, which reduces the thickness of the substrate 100 and the semiconductor package formed thereof.

The first surface finishing layer 140 and the second surface finishing layer 150 may comprise of a single layer or multiple layers. The first surface finishing layer 150 is formed on the second upper surface of the second metal layer 130 (such as the second upper surface 131u of the bond pad 131 and the second upper surface 132u of the die-attach barrier 132). The first surface finishing layer 140 and the second surface finishing layer 150 is selected from the group consisting of Au, Pd, Ni, Cu, Sn, Ag and combinations thereof.

Figure 2:
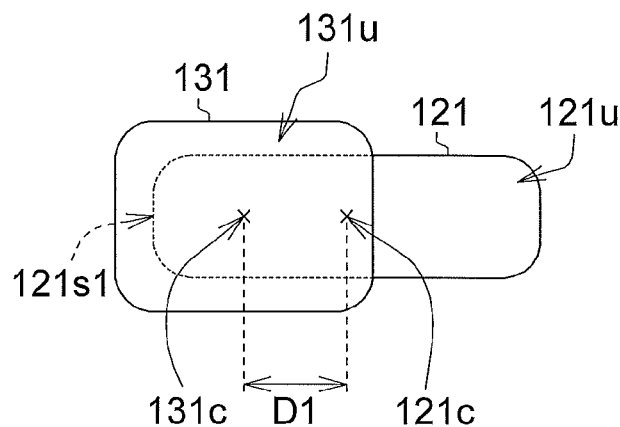
FIG. 2 shows a top view of the lead pad and the bond pad according to FIG. 1.
Figure 8:
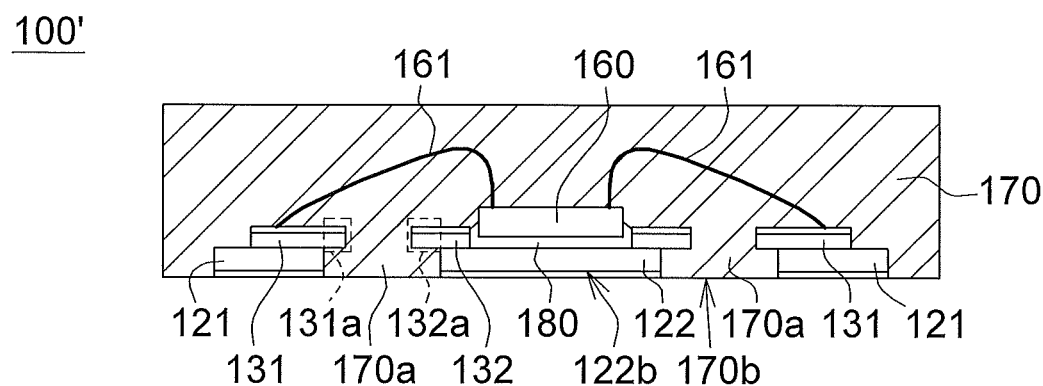
FIG. 8 shows a cross-sectional view of the semiconductor package of an embodiment of the invention.

Referring to FIG. 2, a top view of the lead pad and the bond pad according to FIG. 1 is shown. Preferably but not limited, the area of the second upper surface 131u of the bond pad 121 is smaller than the area of the first upper surface 121u of the lead pad. This helps to reduce the amount of precious metals (such as Au) used on the second finishing layer. It also exposes more upper surface area of the lead pad 121 for better adhesion after forming the semiconductor package (FIG. 8).

Referring to FIG. 2, the center 121c of the lead pad 121 is offset a first distance D1 from the center 131c of the corresponding bond pad 131. In addition, the center 121c is the geometric centre of the first upper surface 121u of the lead pad 121, and the center 131c is the geometric centre of the second upper surface 131u of the lead pad 131. The first metal layer 120 and the second metal layer 130 form at least one a step feature so that the adhesion between the encapsulation layer 170, the first metal layer 120 and the second metal layer 130 is improved.

Figure 3:
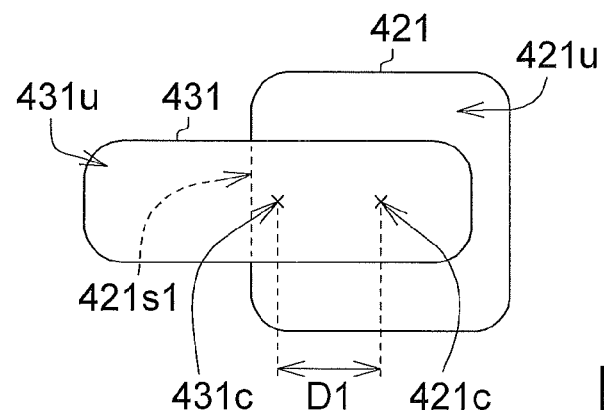
FIG. 3 shows a top view of the lead pad and the bond pad of another embodiment.

Referring to FIG. 3, a top view of the lead pad and the bond pad of another embodiment is shown. The edge 421s1 of the lead pad 421 faces towards the die-attach pad. Preferably but not limited, the area of the second upper surface 431u of the bond pad 431 is smaller than the area of the second upper surface 421u of the bond pad 421. The center 421c of the lead pad 421 is offset a first distance D1 from the center 431c of the corresponding bond pad 431. Preferably but not limited to, the center 431c of the bond pad 431 coincides with that of the corresponding lead pad 421 such that the bond pad 431 is firmly disposed on the lead pad 421

Figure 4:
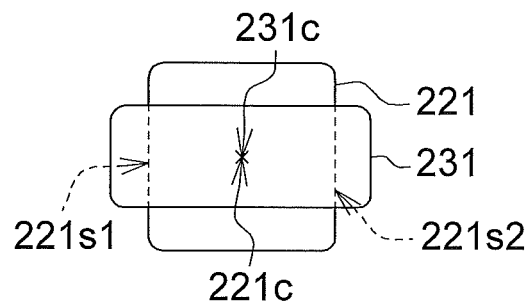
FIG. 4 shows a top view of the lead pad and the bond pad of another embodiment.

Referring to FIG. 4, a top view of the lead pad and the bond pad of another embodiment is shown. The center 221c of the lead pad 221 substantially coincides with the center 231c of the corresponding bond pad 231. Under this situation, the two edges of the bond pad 231 protrude from the corresponding two edges 221s1 and 221s2 of the lead pad 221.

The locking anchorage 131a (shown in FIG. 1) of the bond pad 131 overhangs outward from the edge 121s1 of the lead pad 121, wherein the edge 121s1 is facing towards the die-attach pad 122, in other embodiments, the bond pad may overhang outward from other edge of the lead pad. The following description is made with reference to FIG. 5.

Figure 5:
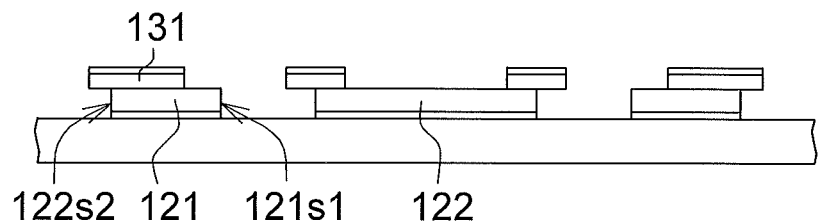
FIG. 5 shows a cross-sectional view of the lead pad and the bond pad of another embodiment.

Referring to FIG. 5, a cross-sectional view of the lead pad and the bond pad of another embodiment is shown. The bond pad 131 overhangs outward from the edge 121s2 of the lead pad 121, wherein the edge 121s2 is opposite to the edge 121s1. According to this embodiment, the edge 121s2 and the edge 12151 are two opposite edges of the bond pad 131.

Figure 6:
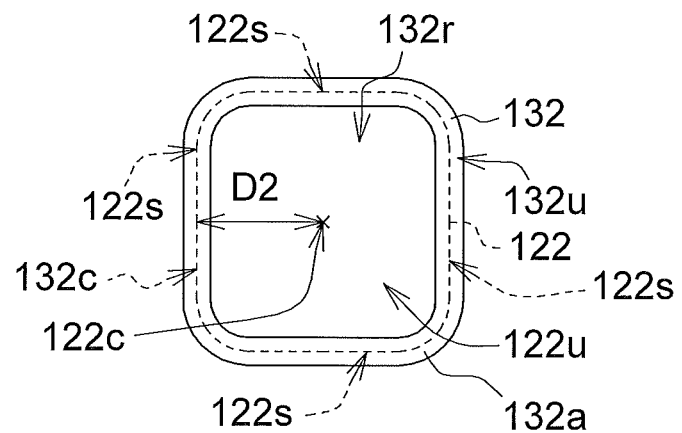
FIG. 6 shows a top view of the die-attach pad and the die-attach barrier in FIG. 1.

Referring to FIG. 6, a top view of the die-attach pad and the die-attach barrier in FIG. 1 is shown. The die-attach pad 122 has a first upper surface 122u. The die-attach barrier 132 of the second metal layer 130 surrounds the die-attach pad 122. The die-attach barrier 132 is formed along the peripheral of the die-attach pad 122 and has a second upper surface 132u. Wherein, the peripheral of the die-attach pad 122 is covered by the die-attach barrier 132, and part of the first upper surface 122u of the die-attach pad 122 is exposed. Preferably but not limited, the area of the second upper surface 132u of the die-attach barrier 132 is smaller than the area of the first upper surface 122u of the die-attach pad 122 to reduce amount of precious metals (such as Au) used on the second surface finishing layer and exposes more upper surface area of the external pad for better adhesion after forming the semiconductor package (FIG. 8).

The locking anchorage 132a (shown in FIG. 1) of the die-attach barrier 132 overhangs outward from the edge 122s of the die-attach pad 122. Part of the die-attach barrier extends beyond the edges of the die-attach pad to create a locking anchorage for the barrier/die-attach pad structure within the semiconductor package (FIG. 8) to prevent the structure from dropping out and improve package reliability. Preferably but not limited, the length of the locking anchorage is between 10 um to 80 um. In addition, the center 122c of the die-attach pad 122 is offset a second distance D2 from the corresponding extended axis of the die-attach barrier 132 wherein the center 122c is the geometric center of the die-attach pad 122.

The first upper surface of the first metal layer is exposed to form a die disposing surface. Furthermore, the die-attach barrier 132 defines at least one cavity 132r. The cavity 132r exposes the first upper surface 122u of the die-attach pad 122. Preferably but not limited, the die-attach barrier 132 is a ground ring which defines the cavity 132r; or, in another embodiment, the die-attach barrier 132 comprises of several blocks, and these blocks are positioned separately around the die-attach pad to form the cavity 132r, or these blocks are connected together to form the cavity 132r.

Figure 7A:
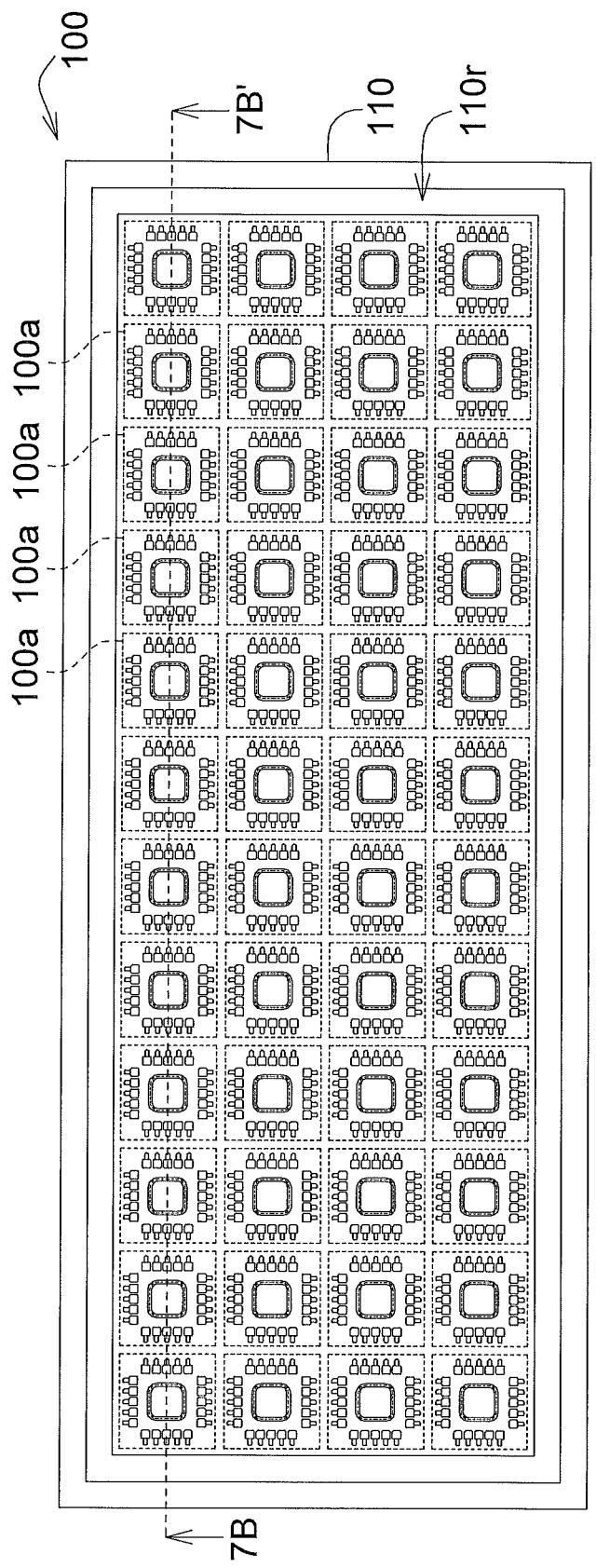
FIG. 7A shows a top view of the substrate in FIG. 1.
Figure 7B:
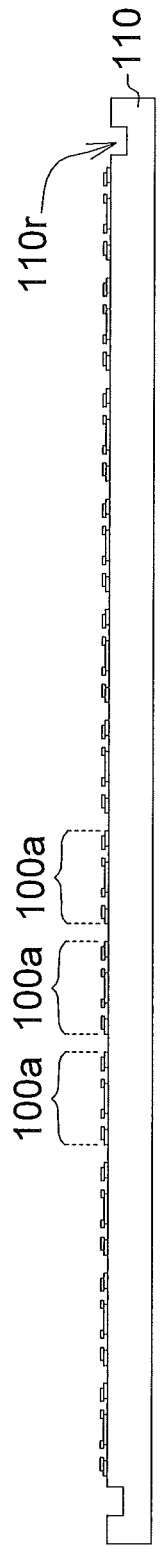
FIG. 7B shows the cross-sectional view of FIG. 7A along the direction of 7B-7B'

Referring to FIGS. 7A and 7B, a top view of the substrate in FIG. 1 is shown in FIG. 7A, and the cross-sectional view of FIG. 7A along the direction of 7B-7B' is shown in FIG. 7B. The conductive carrier 110 comprises a cavity 110r formed along a peripheral of the conductive carrier 110. In one embodiment, the cavity 110r may be omitted.

Referring to FIG. 8, a cross-sectional view of the semiconductor package of an embodiment of the invention is shown. The semiconductor package 100' comprises a first metal layer 120, a second metal layer 130, a first surface finishing layer 140, a second surface finishing layer 150, a semiconductor die 160 and an encapsulation layer 170. The first metal layer 120 forms at least an lead pad 121 and at least a die-attach pad 122. Correspondingly, the second metal layer 130 forms a bond pad 131 on the lead pad 121 and a die-attach barrier 132 on the die-attach pad 122.

When there are two or more semiconductor dies 160, the number of the die-attach pads 122 may be the same as the semiconductor dies 160. Or, more semiconductor dies 160 may be positioned on a single die-attach pad 122.

The semiconductor die 160 is positioned within the cavity 132r and adhered to the first upper surface 122u of the die-attach pad 122 by an adhesive 180, wherein adhesive 180 is constrained within the cavity 132r by the die-attach barrier 132. Because of the design of the die-attach barrier 132, the adhesive 180 will not spill over to the neighboring semiconductor die or out of the die-attach pad which can affect reliability. Preferably but not limited, the adhesive 180 herein is die-attach epoxy or film.

The semiconductor die 160 is electrically connected to the bond pad 131 through at least one first connection element 161. Preferably but not limited, the first connection element 161 is gold wire, and the first connection element 161 connects the semiconductor die 160 to the second surface finishing layer 150, for electrically connections between the semiconductor die 160 and the bond pad 131.

Although not shown in FIG. 8, in other embodiments, at least one second connection element may connect the semiconductor die 160 to the die-attach barrier 132 for electrically grounding purposes. Preferably but not limited, the second connection element is gold wire.

The encapsulation layer 170 comprises of novolac-based resin, epoxy-based resin and silicone-based resin and any encapsulation material. The encapsulation layer 170 may also comprises of suitable filling agent, such as powder silicon dioxide. In this embodiment, the encapsulation layer 170 is preferably (but not limited) molding compound. The encapsulation layer 170 encapsulates the first metal layer 120, the second metal layer 130 and the semiconductor die 160, wherein the first surface finishing layer 140 is exposed from the encapsulation layer 170. In other embodiment, the semiconductor package 100' may omit the first surface finishing layer 140. Under this situation, the first lower surface 121b of the lead pad 121 and the second lower surface 122b of the die-attach pad 122 are exposed from the encapsulation layer 170. Regardless whether the first surface finishing layer 140 or the first metal layer 120 is exposed, the semiconductor package 100' can be subsequently attached to external circuit board via the lead pad 121b and the die-attach pad 122 for electrical connection and heat dissipation. Furthermore, solder ball may be attached to the lead pad 121.

Figure 9:
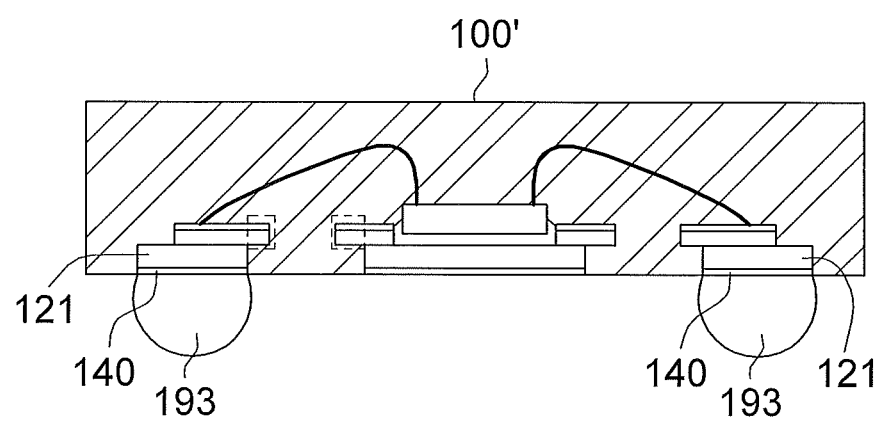
FIG. 9 shows at least one solder ball formed on the semiconductor package.

Referring to FIG. 9, at least one solder ball formed on the semiconductor package is shown. The semiconductor package shown in FIG. 9 comprises at least one solder ball 193 formed on the lead pad 121 or the first surface finishing layer 140. The semiconductor package shown in FIG. 9 is disposed on the external circuit through the solder balls 193.

The encapsulation layer 170 has at least a connection part 170a, and it is positioned between the die-attach pad 122 and the lead pad 121. Because the locking anchorage 131a of the bond pad 131 overhangs outward from the edge of the lead pad 121, the locking anchorage 131a is positioned on the connection part 170a, the bond pad 131 is more securely positioned on the lead pad 121. Furthermore the locking anchorage 131a of the bond pad 131 is rigidly anchored within the insulation layer 170 such that the bond pad/lead pad structure will not drop out easily and gives better reliability. Similarly, because the locking anchorage 132a of die-attach barrier 132 overhangs outward from the edge of the die-attach pad 122, the locking anchorage 132a is positioned on the connection part 170a, the die-attach barrier 132 is more securely positioned on the die-attach pad 122. Furthermore the locking anchorage 132a of the die-attach barrier 132 is rigidly anchored within the insulation layer 170 such that the die-attach barrier/die-attach pad structure will not drop out easily and gives better reliability.

The following paragraphs describe a method of forming the substrate depicted in FIG. 1. The processes of manufacturing the substrate of FIG. 1 are shown in FIGS. 10A-10I.

Figure 10A:
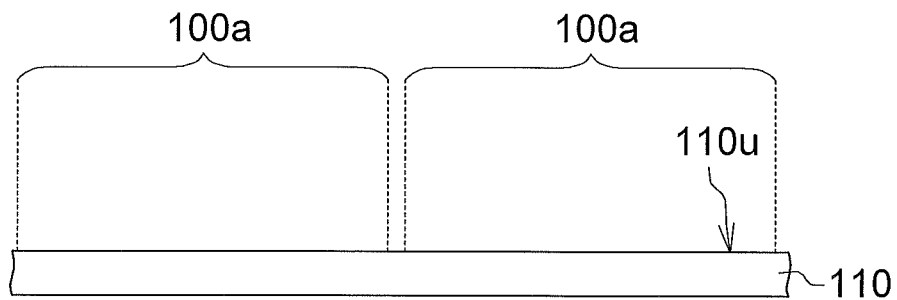
FIGS. 10A-10I show the processes of manufacturing the substrate of FIG. 1.

As shown in FIG. 10A, a conductive carrier 110 is provided. The conductive carrier 110 comprises an upper surface 110u and may be made of a single layer or multiple layers. For multiple layers, the conductive carrier 110 comprises an inner layer and an outer clad layer. Preferably but not limited, the inner layer is steel having a coefficient of thermal expansion (CTE) between 10 to 15 ppm/° C. and the outer clad layer is copper. Compared to copper, the thermal expansion coefficient (CTE) of steel is closer to or matches the CTE of the molding compound used to form the subsequent encapsulation layer such that the warpage of the substrate during the manufacturing of the semiconductor package 100' is significantly reduced. This enables full block array layout to be formed with large frame size to increase unit density as per FIG. 7A and reduce cost significantly. The copper clad layer allows the conductive carrier to be processed as per full copper or copper-alloy carrier to form the substrate.

In addition, the conductive carrier 110 defines an array of substrate unit region 100a, the cavity 110r surrounds a substrate unit region 100a or a plurality of substrate unit regions 100a. To illustrate the features of the structure more clearly, the structure of single substrate unit region 100a is shown in 10C to 10I.

A first photo-resist layer 190 is formed on the upper surface 110u of the conductive carrier 110, preferably by lamination, screen-printing or spin-coating process.

Figure 10B:
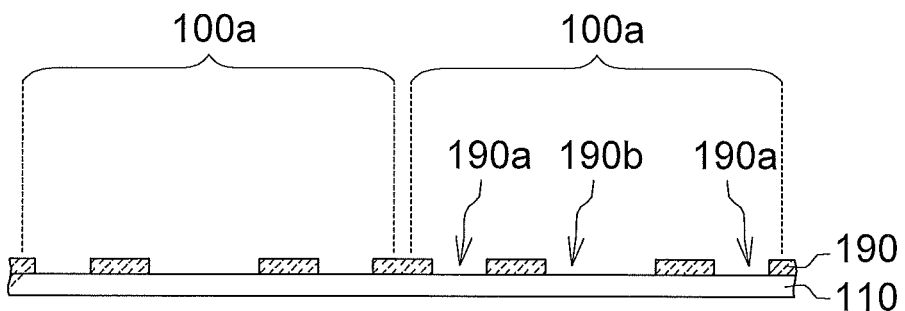

As shown in FIG. 10B, at least one lead pad opening 190a is formed on the first photo-resisting layer 190 to expose the upper surface 110u of the conductive carrier 110, preferably by photolithography.

At least one die-attach pad opening 190b is formed on the first photo-resisting layer 190. Preferably but not limited, the lead pad opening 190a and the die-attach pad opening 190b are formed simultaneously during the same process.

Figure 10C:
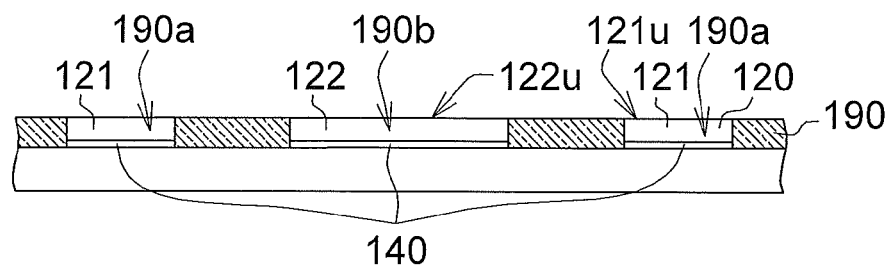

As shown in FIG. 10C, a first surface finishing layer 140 is formed in the lead pad opening 190a and the die-attach pad opening 190b of the first photo-resist layer 190 on the upper surface 110u of the conductive carrier 110, preferably by electrolytic plating. In other embodiments, the first surface finishing layer 140 may be omitted; or the first surface finishing layer 140 may be formed after the substrate 110 has been removed (Please refer to the contents in FIG. 12).

As shown in FIG. 10C, a first metal layer 120 is subsequently formed in the lead pad opening 190a and the die-attach pad opening 190b of the first photo-resist layer 190 on the upper surface of the first surface finishing layer 140, preferably by electrolytic plating. In another embodiment when the first surface finishing layer 140 may be omitted, the first metal layer 120 is formed directly on the upper surface 110u on the conductive carrier 110.

The first metal layer 120 forms at least one lead pad 121 and die-attach pad 122. The lead pad 121, having a first upper surface 121u, is formed in the lead pad opening 190a on the first photo-resisting layer. The die-attach pad 122, having a first upper surface 122u, is formed in the die-attach opening 190a on the first photo-resisting layer 190.

Figure 10D:
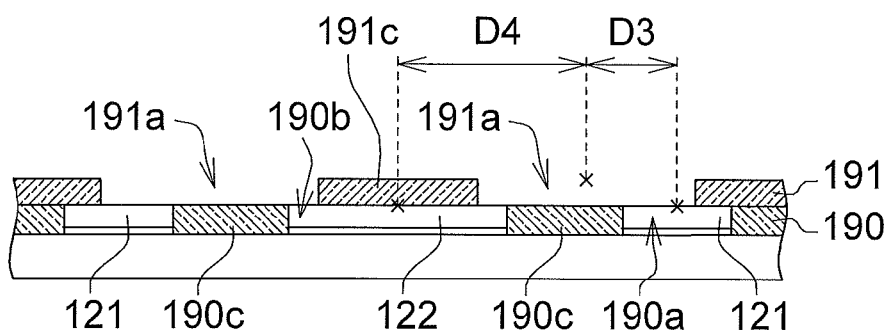

As shown in FIG. 10D, a second photo-resist layer 191 is formed on the first photo-resist layer 190, preferably by lamination, screen-printing or spin-coating process.

As shown in FIG. 10D, at least one bond pad opening 191a is formed on the second photo-resisting layer 191, preferably by photolithography to expose preferably part of the first upper surface 121u of the lead pad 121 and part of the first upper surface 122u of the die-attach pad 122 in the bond pad opening 191a. In addition, a part 190c of the first photo-resist layer 190 is exposed from the opening 191a.

The bond pad opening 191a exposes preferably part of the first upper surface 121u of the lead pad 121 and part of the first upper surface 122u of the die-attach pad 122, such that the bond pad 122 and the die-attach barrier 132 is formed on the exposed lead pad 121 and the exposed die-attach pad 122. In addition, since the second photo-resist layer 191 does not cover the part 190c of the first photo-resist layer 190, the locking anchorage 131a and 132a (shown in FIG. 10E) are allowed to form without being confined by the first photo-resist layer 190 and overhang outward from the edge 121s1 of the lead pad 121 and the edge 122s of the die-attach pad 122 respectively to form on the part 190c. In one embodiment, the second photo-resist layer 191 may cover a part (for example, the middle portion of the part 190c or other portion except the part 190c) of the part 190c of the first photo-resist layer 190. Furthermore the size and location of the bond pad opening 191a determine the design of the bond pad 131 and the die-attach barrier 132 as well as the directions of the locking anchorage 131a and 132a.

The second photo-resist layer 191 covers a part of the lead pad 121, such that the area of the second upper surface 131u of the bond pad 131 is smaller than the area of the first upper surface 121u of the lead pad 121.

The center of the lead pad opening 190a of the first photo-resist layer 190 is offset a third distance D3 from the center of the bond pad opening 191a of the second photo-resist layer 191. The center of the die-attach pad opening 190b of the first photo-resist layer 190 is offset a third distance D4 from the center of the bond pad opening 191a of the second photo-resist layer 191.

In addition, part 191c of the second photo-resist layer 191 may correspond to the center area of the die-attach pad 122 thus enabling the die-attach barrier 132 to form around the die-attach pad such that its geometric center may substantially coincide with the center 122c of the die-attach pad 122 (center 122c is in FIG. 6).

Figure 10E:
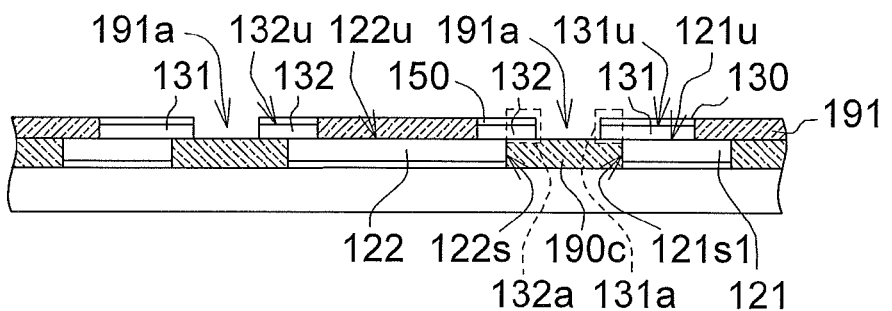

As shown in FIG. 10E, a second metal layer 130 is formed, preferably by electrolytic plating. The second metal layer 130 forms at least one bond pad 131 and at least one die-attach barrier 132.

The bond pad 131 and the die-attach barrier 132 are formed on the lead pad 121 and the die-attach pad 122 respectively. The bond pad 131, having a second upper surface 131u, is formed in the bond pad opening 191a of the second photo-resist layer 191. The bond pad 131 overlaps and in contact with the first upper surface 121u of the lead pad 121 as exposed in the bond pad opening 191a of the second photo-resist layer 191, wherein the area of the second upper surface 131u of the bond pad 131 is smaller than the area of the first upper surface 121u of the lead pad 121.

The die-attach barrier 132 is formed in the bond pad opening 191a of the second photo-resist layer 191 and is positioned surrounding the die-attach pad 122. The die-attach barrier has a second upper surface 132u, wherein the area of the second upper surface 132u is smaller than the area of the area of the first upper surface 122u of the die-attach pad 122. The die-attach barrier 132 defines the die-attach cavity 132r from which the first upper surface 122u of the die-attach pad 122 is exposed.

After the bond pad 131 is formed, the center 121c of the lead pad 121 is offset a first distance D1 from the center 131c of the bond pad 131 (first distance D1 is illustrated in FIG. 2.). Similarly, the center 122c of the die-attach pad 122 is offset a second distance D2 from the extended axis 132c of the die-attach barrier 132 (second distance D2 is illustrated in FIG. 1 and FIG. 6).

During the electrolytic plating, the second metal layer extends beyond the edge of the lead pad 121 and the die-attach barrier 132 in directions where the part 190c of the first photo-resist layer 190 is exposed. Under such circumstance, the locking anchorage 131a of the bond pad 131 overhangs outward from the edge 121s1 of the lead pad 121, and the locking anchorage 132a of the die-attach barrier 132 overhangs outward from the edge 122s of the die-attach pad 121.

The size of the locking anchorage 131a of the bond pad 131 is preferably between 10 um to 80 um. The size of the locking anchorage 131a does not affect the removing of the first photo-resist layer 190 and the second photo-resist layer 191. That is, the first photo-resist layer 190 and the second photo-resist layer 191 can be completely removed. Similarly, the size of the locking anchorage 132a of the die-attach barrier 132 is between 10 um to 80 um. The size of the locking anchorage 132a does not affect the removing of the first photo-resist layer 190 and the second photo-resist layer 191. That is, the first photo-resist layer 190 and the second photo-resist layer 191 can be completely removed.

The locking anchorage 131a and 132a are not limited to extend in a single direction. In another embodiment, the locking anchorage 131a and/or 132a may extend and overhang outward on two edges or multiple edges for better anchoring of the structure. In addition, the design of the locking anchorage 131a and 132a is not limited to the embodiments in the invention.

Referring further to FIG. 10E, a second surface finishing layer 150 is formed on the second metal layer 130, preferably by electrolytic plating and covers the bond pad 131 and the die-attach barrier 132. In other embodiments, the second surface finishing layer 150 may be omitted or selective plating may be performed by means of a third photo-resist layer (not shown) to further reduce the area of the second surface finishing layer formed on the second metal layer.

Figure 10F:
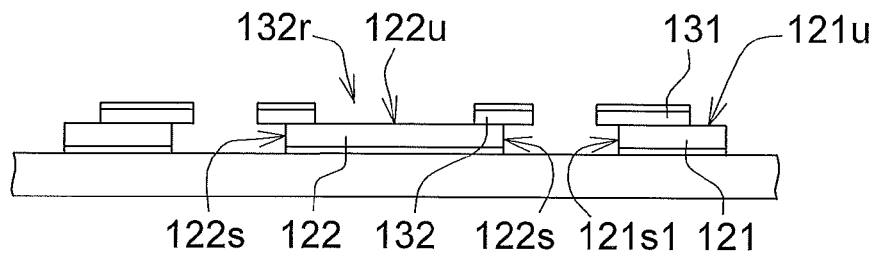

As shown in FIG. 10F, the first photo-resist layer 190 and the second photo-resist layer 191 are removed by chemical stripping to form the substrate 100 depicted in FIG. 1. After the first photo-resist layer 190 and the second photo-resist layer 191 are removed, part of the first upper surface 121u of the lead pad 121 is exposed.

The following paragraphs describe a method of forming the semiconductor package shown in FIG. 8. The descriptions start after the semiconductor substrate is formed as shown in FIG. 10F after the removal of the first photo-resist layer 190 and the second photo-resist layer 191.

Figure 10G:
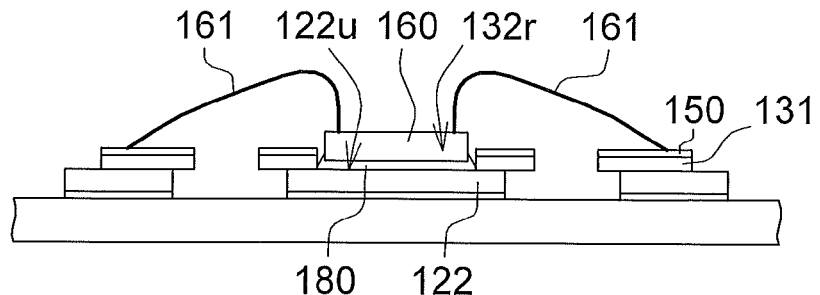

As shown in FIG. 10G, at least one semiconductor die 160 is positioned on the die-attach pad 122, wherein the semiconductor die 160 is positioned in the cavity 132r and adhered to the first upper surface 122u of the die-attach pad 122 by an adhesive 180. The die-attach barrier contains the epoxy within the defined cavity of the die-attach pad to prevent the adhesive from seeping out onto unnecessary regions. Preferably but not limited, the adhesive 180 is thermally-cured after adhering the semiconductor to the die-attach pad.

As shown in FIG. 10G, the semiconductor die 160 is electrically connected to the bond pad 131 via first connection element 161, preferably by wire-bonding. The first connection element 161 connects the semiconductor die 160 to the second surface finishing layer 150 (or the bond pad 131 under the circumstance where the second surface finishing layer is omitted). Although not shown, the first connection element may also connect the semiconductor die 160 to the die-attach barrier 132.

Figure 10H:
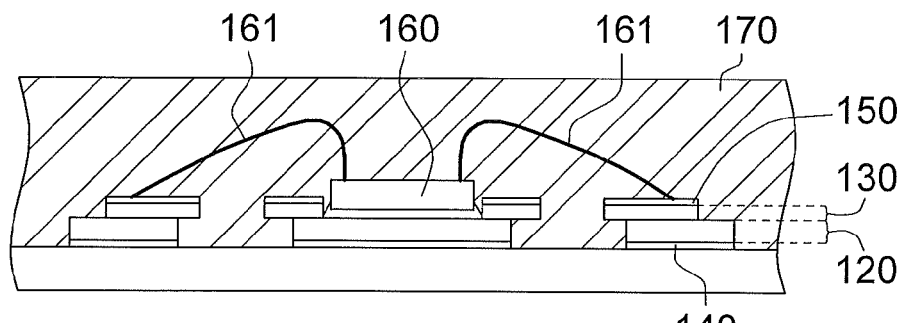

As shown in FIG. 10H, the first metal layer 120, the second metal layer 130 and the semiconductor die 160 are encapsulated by an encapsulation layer 170. Furthermore, the encapsulation layer 170 also encapsulates the first connection element 161, the adhesive 180, the first surface finishing layer 140, the second surface finishing layer 150 and the upper surface 110u of the conductive carrier. Preferably, the encapsulation layer is formed by compression molding, injection molding or transfer molding with molding compound.

Prior to forming the encapsulation layer, the exposed surface of the first metal layer 120 may be chemically enhanced with brown or black oxide treatment to improve the adhesion with the molding compound for better reliability.

Figure 10I:
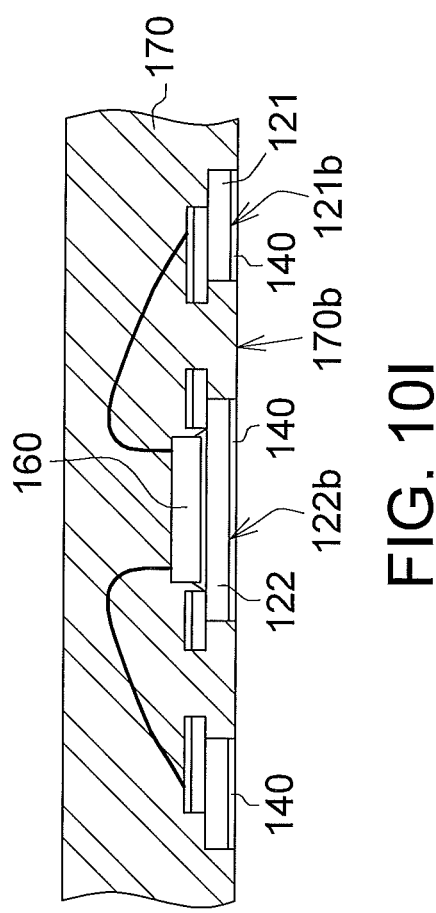

As shown in FIG. 10I, the conductive carrier 110 is removed, preferably by chemical etching, to expose the first surface finishing layer 140 and the third lower surface 170b of the encapsulation layer 170. Under the circumstance where the first surface finishing layer 140 is omitted, the first lower surface 121b of the lead pad 121 is exposed.

Figure 11:
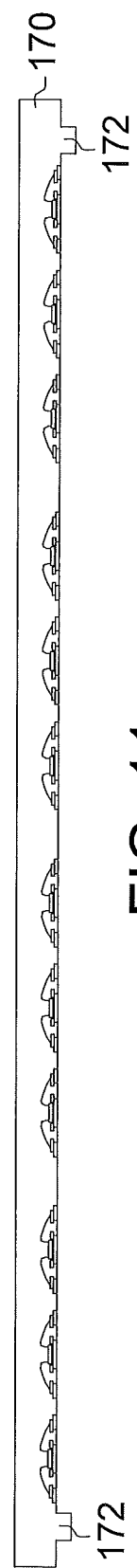
FIG. 11 shows the cross-sectional view of the semiconductor structure depicted in FIG. 10I after the conductive carrier is removed.

FIG. 11 shows the cross-sectional view of the semiconductor structure depicted in FIG. 10I after the conductive carrier is removed. After the conductive carrier 110 is removed, the protruding wall 172 is exposed. Wherein, the shape and the position of the protruding wall 172 correspond to that of the cavity 110r of the conductive carrier 110. As such, the protrusion wall 172 may be a continuous ring or several separately positioned blocks. The protrusion wall 172 strengthens the semiconductor structure for subsequent handling and processing to prevent damage especially when the thickness is less than 0.5 mm, thus enabling thin semiconductor package to be formed.

In another embodiment, the protrusion wall may be form on upper portion of the encapsulation layer. Through the design of a slot in the top mold tool corresponding to the protrusion wall, after the encapsulation layer is formed, the protrusion wall is formed on upper portion of the encapsulation layer. Under this situation, the cavity 110r on the conductive carrier 110 may be omitted.

Subsequently solder ball 193 may be formed on the lead pad 121 or the first surface finishing layer 140.

The semiconductor package 100' as shown in FIG. 8 or 9 is subsequently formed after singulation using laser or mechanical sawing. Moreover, solder balls may be attached to the lead pad 121 before or after singulation. In singulation, the protruding wall 172 of FIG. 11 is removed.

When using the conductive carrier with a cavity to form the protrusion wall 172, the manufacturing method further comprises of forming at least one cavity 110r in the conductive carrier 110 as shown in FIG. 10A, preferably by photolithography followed by chemical etching.

Figure 12:
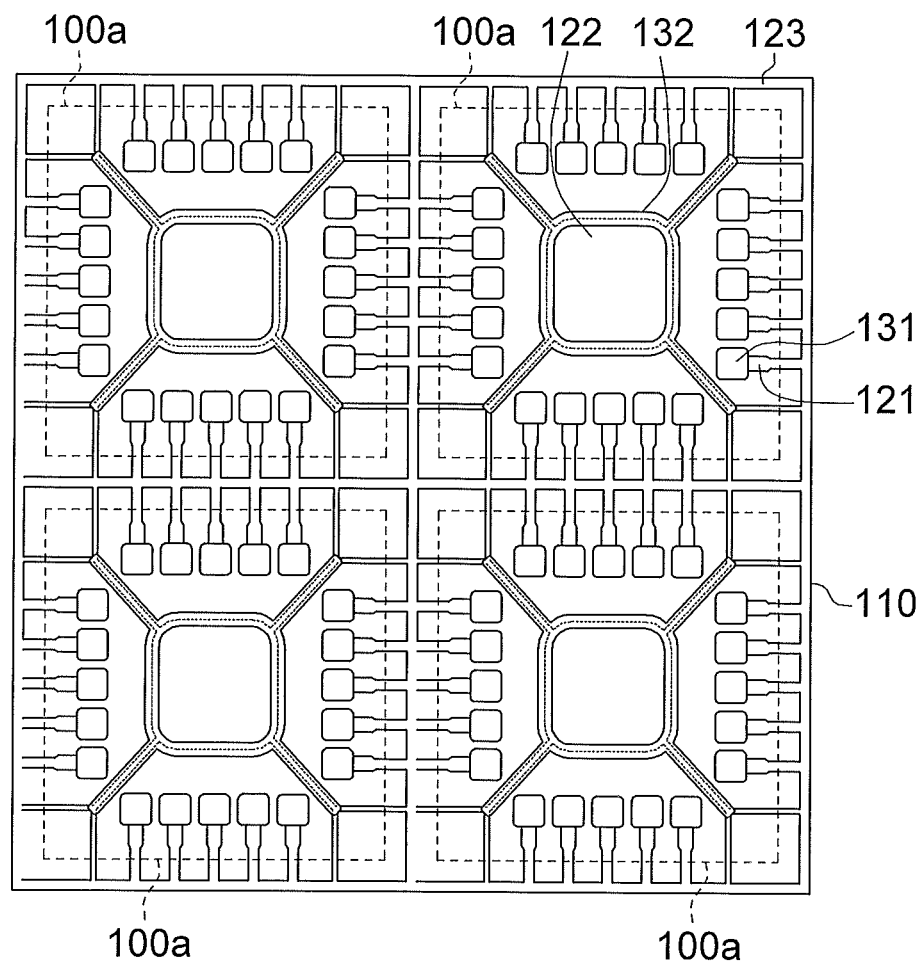
FIG. 12 show the top view of a substrate of another embodiment.

Referring to FIG. 12, the top view of a substrate of another embodiment is shown. The first metal layer 120 on the conductive carrier 110 comprises a connection frame 123. The connection frame 123 connects all lead pad 121 and all die-attach pad 122 together such that all lead pad 121 and all die-attach pad 122 are electrically connected via the connection frame. By means of the connection frame, the first surface finishing layer 130 may be formed by electrolytic plating after the conductive carrier 110 has been removed. Specifically, since the lead pad 121 and the die-attach pad 122 are electrically connected by the connection frame 123, if the electrode (not illustrated) of the electrolytic plating device is connected to the connection frame 123, electrical current will be able to flow through and the finishing layer 140 may be formed on the first lower surface 121b of the lead pad 121 (FIG. 10I) and on the first lower surface 122b of the die-attach pad 122 (FIG. 10I). In the subsequent sawing process, the semiconductor package 100' is singulated according to the edges of the substrate unit region 100a to remove the connection frame 123 such that the lead pad 121 is electrically isolated from one another as well as from the die-attach pad 122. In the embodiment, the edge of the lead pad 121 is exposed on the side of the semiconductor package 100' after the sawing process.

The above embodiments of the invention describe the structure of the semiconductor package, substrate and the method of forming thereof and their unique features are listed below:

(1) The encapsulation layer has at least one connection part, the bond pad and the die-attach barrier interlock with the connection part such that the bond pad and the die-attach barrier are positioned more stably.

(2). The bond pad and the lead pad, as well as the die-attach barrier and the die-attach pad form locking anchorages that helps to anchor the respective structures within the molding compound to improve reliability by prevent the respective structures from dropping out from the package.

(3). A step feature is formed between the bond pad and the external lead to expose the upper surface of the external lead and improve the adhesion of the structure to the molding compound. The exposed surface may be further treated chemically with brown or black oxide to enhance the adhesion strength with the molding compound and improve reliability.

(4). A cavity is defined by the die-attach barrier on the die-attach pad for containing the adhesive when adhering a semiconductor die to the die-attach pad. Due to the presence of the cavity, the adhesive will not seep out onto unnecessary regions, hence improving reliability. Furthermore, the cavity may also help to reduce the overall semiconductor package thickness by placing the die lower than the bond pad/die-attach barrier level.

(5) The first metal layer and the second metal layer form a leadframe structure; the leadframe structure may be a very thin electrolytic plated layer that reduces the thickness of the substrate and hence the semiconductor package.

(6) The encapsulation layer has least one protruding wall. The protruding wall helps to reduce warpage and strengthen the structure of the semiconductor package during the manufacturing, assembly and handling process. This enables thin semiconductor packaging.

(7). The use of steel material as the conductive carrier having compatible coefficient of thermal expansion (CTE) with conventional molding compound minimizes warpage during the manufacturing process by reducing CTE mismatch and enables a full block array substrate unit layout to be formed.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A substrate, comprising:
   a conductive carrier;
   a first metal layer formed on the conductive carrier, wherein the first metal layer comprises a lead pad and a die-attach pad, both having a first upper surface; and
   a second metal layer formed on the first metal layer, wherein the second metal layer comprises a bond pad and a die-attach barrier both having a second upper surface;
   wherein the bond pad overlaps and in contact with the first upper surface of the lead pad, the first upper surface of the lead pad is partially exposed and a part of the bond pad overhangs outward from an edge of the lead pad;
   wherein the die-attach barrier overlaps and in contact with the first upper surface of the die-attach pad, the die-attach barrier is formed around the die-attach pad, the first upper surface of the die-attach pad is partially exposed and a part of the die-attach barrier overhangs outward from an edge of the die-attach pad.

2. The substrate according to claim 1, wherein the center of the lead pad is offset a first distance from the center of the corresponding bond pad.

3. The substrate according to claim 1, wherein the area of the second upper surface of the bond pad is smaller than the area of the first upper surface of the corresponding lead pad.

4. The substrate according to claim 1, wherein; the area of the second upper surface of the die-attach barrier is smaller than the area of the first upper surface of the corresponding die-attach pad.

5. The substrate according to claim 1, wherein the center of the die-attach pad is offset a second distance from the center of the corresponding die-attach barrier.

6. The substrate according to claim 1, wherein the die-attach barrier defines a cavity from which the first upper surface of the die-attach pad is exposed.

7. The substrate according to claim 1, wherein the die-attach barrier is a ground ring.

8. The substrate according to claim 1, further comprising:
   a first surface finishing layer formed between the conductive carrier and the first metal layer; and
   a second surface finishing layer formed on the second upper surface of the second metal layer.

9. The substrate according to claim 1, wherein the conductive carrier comprises a steel or copper layer.

10. The substrate according to claim 8, wherein the first and second surface finishing layers comprise Au, Pd, Ni, Cu, Sn or Ag, and the first and second metal layers comprise Cu or Ni.

11. The substrate according to claim 8, wherein the conductive carrier further comprises a cavity surrounding a substrate unit region or a plurality of substrate unit regions.

12. A semiconductor package, comprising:
   a first metal layer, wherein the first metal layer comprises a lead pad and a die-attach pad both having a first upper surface and a first lower surface opposite to the first upper surface;
   a second metal layer formed on the first metal layer, wherein the second metal layer comprises a bond pad and a die-attach barrier both having a second upper surface;
   wherein the bond pad overlaps and is in contact with the first upper surface of the lead pad, the first upper surface of the lead pad is partially exposed, and a part of the bond pad overhangs outward from an edge of the lead pad;
   wherein the die-attach barrier overlaps and is in contact with the first upper surface of the die-attach pad, the die-attach barrier is formed around the die-attach pad, the first upper surface of the die-attach pad is partially exposed and a part of the die-attach barrier overhangs outward from an edge of the die-attach pad;
   a semiconductor die electrically connected to the bond pad via a plurality of first connection elements; and
   an encapsulation layer encapsulating the first metal layer, the second metal layer and the semiconductor die.

13. The semiconductor package according to claim 12, wherein the center of the lead pad is offset a first distance from the center of the corresponding bond pad.

14. The semiconductor package according to claim 12, wherein the bond pad has a second upper surface, and the area of the second upper surface of the bond pad is smaller than the area of the first upper surface of the corresponding lead pad.

15. The semiconductor package according to claim 12, wherein the area of the second upper surface of the die-attach barrier is smaller than the area of the first upper surface of the corresponding die-attach pad.

16. The semiconductor package according to claim 12, wherein the center of the die-attach pad is offset a second distance from the center of the corresponding die-attach barrier.

17. The semiconductor package according to claim 12, wherein the die-attach barrier defines a cavity from which the first upper surface of the die-attach pad is exposed.

18. The semiconductor package according to claim 12, further comprising:
   a first surface finishing layer formed on the first lower surface of the first metal layer; and
   a second surface finishing layer formed on the second upper surface of the second metal layer.

19. The semiconductor package according to claim 12, wherein the first lower surface of the lead pad and the die-attach pad are exposed from the encapsulation layer.

20. The semiconductor package according to claim 12, wherein the encapsulation layer comprises a protruding wall surrounding a substrate unit region or a plurality of substrate unit regions.

21. The semiconductor package according to claim 17, wherein the semiconductor die is positioned within the cavity of the die-attach barrier and adhered to the first upper surface of the die-attached pad by an adhesive disposed within the cavity of the die-attach barrier.

22. The semiconductor package according to claim 12, wherein the die-attach barrier is a ground ring, and the semiconductor die is electrically connected to the ground ring via a plurality of second connection elements.

23. The semiconductor package according to claim 18, wherein the first and second surface finishing layers comprise Au, Pd, Ni, Cu, Sn or Ag, and the first and second metal layers comprise Cu or Ni.

* * * * *